United States Patent
Sato (10) Patent No.: US 11,555,847 B2
(45) Date of Patent: Jan. 17, 2023

(54) SEMICONDUCTOR INTEGRATED CIRCUIT DEVICE

(71) Applicant: ROHM Co., LTD., Kyoto (JP)

(72) Inventor: Kiminobu Sato, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 81 days.

(21) Appl. No.: 17/121,967

(22) Filed: Dec. 15, 2020

(65) Prior Publication Data

US 2021/0190858 A1    Jun. 24, 2021

(30) Foreign Application Priority Data

Dec. 18, 2019    (JP) .............................. JP2019-228673

(51) Int. Cl.
  *G01R 31/28* (2006.01)
  *H01L 27/02* (2006.01)
  *H03K 17/082* (2006.01)

(52) U.S. Cl.
  CPC ...... *G01R 31/2884* (2013.01); *H01L 27/0251* (2013.01); *H03K 17/0822* (2013.01)

(58) Field of Classification Search
  CPC ............ H01L 27/0251; H03K 17/0822; H03K 17/18; H03K 17/22; H03K 2217/0081; G01R 31/2884; G01R 19/16552; G01R 31/40; G01R 31/54
  See application file for complete search history.

(56) References Cited

U.S. PATENT DOCUMENTS

| | | | |
|---|---|---|---|
| 9,640,982 B2 * | 5/2017 | Chi | ........................... H02J 3/36 |
| 2017/0030948 A1 * | 2/2017 | Baldwin | ............... H01L 27/088 |
| 2021/0143811 A1 * | 5/2021 | Namuduri | ........ H03K 17/08122 |

* cited by examiner

*Primary Examiner* — Alvaro E Fortich
*Assistant Examiner* — Zannatul Ferdous
(74) *Attorney, Agent, or Firm* — Chip Law Group (57) ABSTRACT

A semiconductor integrated circuit device includes a control unit configured to control a switching element or an output transistor of a power supply device, a monitor terminal for monitoring an output voltage of the power supply device, a test unit configured to output a test signal to the monitor terminal before activation of the power supply device, and a determination unit configured to determine whether or not the monitor terminal is open, on the basis of a voltage of the monitor terminal when the test unit outputs the test signal to the monitor terminal.

11 Claims, 5 Drawing Sheets

SEMICONDUCTOR INTEGRATED CIRCUIT DEVICE

CROSS REFERENCE TO RELATED APPLICATIONS

This application claims priority benefit of Japanese Patent Application No. JP 2019-228673 filed in the Japan Patent Office on Dec. 18, 2019. Each of the above-referenced applications is hereby incorporated herein by reference in its entirety.

BACKGROUND

The present disclosure relates to a semiconductor integrated circuit device.

Recent years have seen a growing demand for functional safety of components used in advanced driver assistance systems (ADASes) and the like mounted to vehicles. For example, functional safety of components can be realized by preventing malfunction of the components in the event of detection of anomaly thereof. Accordingly, anomaly detection techniques have recently been growing in importance.

SUMMARY

In the case of a semiconductor integrated circuit device whose components are part of a power supply device, if a monitor terminal provided in the semiconductor integrated circuit device to monitor an output voltage of the power supply device is open, the power supply device may produce an inappropriate output voltage, possibly adversely affecting other components that use the output voltage of the power supply device.

It should be noted that a semiconductor integrated circuit device (power supply integrated circuit (IC)) having a monitor terminal (feedback terminal) is disclosed in Japanese Patent Laid-Open No. 2014-121103, for example.

It is desirable to provide a semiconductor integrated circuit device capable of determining, prior to activation, whether or not the monitor terminal is open.

A semiconductor integrated circuit device disclosed in the present specification includes a control unit that controls a switching element or an output transistor of a power supply device, a monitor terminal for monitoring an output voltage of the power supply device, a test unit that outputs a test signal to the monitor terminal before activation of the power supply device, and a determination unit that determines whether or not the monitor terminal is open, on the basis of the voltage of the monitor terminal when the test unit outputs the test signal to the monitor terminal (first configuration).

In the semiconductor integrated circuit device having the first configuration, in the case where the monitor terminal is open, the output of the test signal from the test unit to the monitor terminal increases the voltage of the monitor terminal (second configuration).

In the semiconductor integrated circuit device having the second configuration, in the case where the monitor terminal is not open, an output capacitor of the power supply device keeps, to a minimum, an increase in the voltage of the monitor terminal caused by the output of the test signal from the test unit to the monitor terminal (third configuration).

In the semiconductor integrated circuit device having the third configuration, a discharge unit may be provided to discharge the output capacitor (fourth configuration).

In the semiconductor integrated circuit device having the fourth configuration, the determination unit may determine whether or not a discharge state of the output capacitor falls within a given range (fifth configuration).

In the semiconductor integrated circuit device having any one of the first to fifth configurations, the test unit may not output the test signal after the activation of the power supply device (sixth configuration).

A vehicle disclosed in the present specification includes the semiconductor integrated circuit device having any one of the first to sixth configurations (seventh configuration).

According to the semiconductor integrated circuit devices disclosed in the present specification, it is possible to determine, prior to activation, whether or not the monitor terminal is open.

DETAILED DESCRIPTION OF THE PREFERRED EMBODIMENT

<1. Semiconductor Integrated Circuit Device According to Embodiment>

Figure 1A:
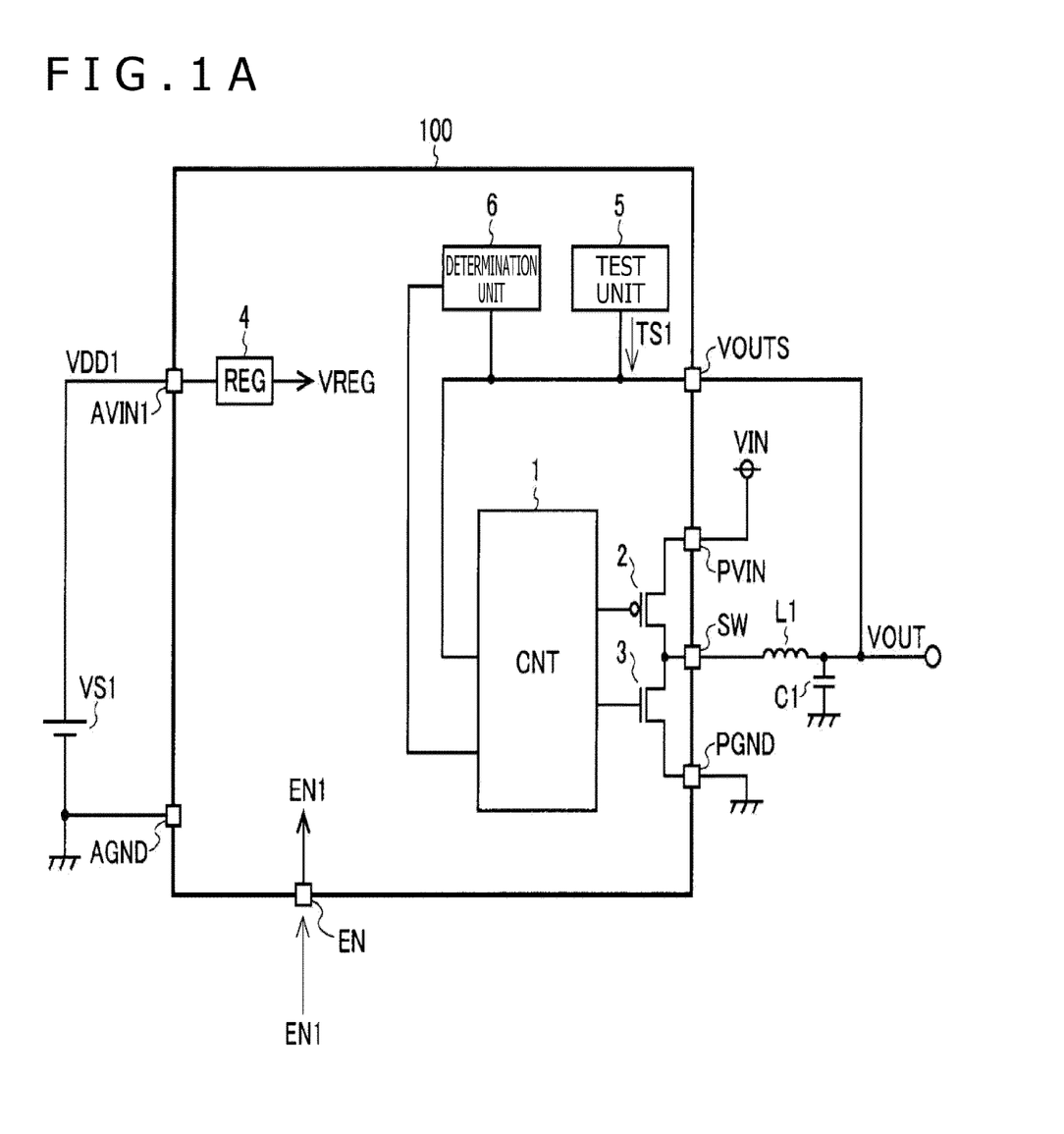
FIG. 1A is a diagram illustrating a configuration of a semiconductor integrated circuit device according to an embodiment.

FIG. 1A is a diagram illustrating a configuration of a semiconductor integrated circuit device 100 according to an embodiment (hereinafter referred to as the "semiconductor integrated circuit device 100").

The semiconductor integrated circuit device 100 and its external components form a switching power supply device. The switching power supply device converts an input voltage VIN to an output voltage VOUT.

The semiconductor integrated circuit device 100 includes a control unit 1, a P-channel metal oxide semiconductor field-effect transistor (MOSFET) 2 as a switching element, an N-channel MOSFET 3 as another switching element, an internal power supply unit 4, a test unit 5, and a determination unit 6.

For example, an inductor L1, an output capacitor C1, and a voltage source VS1 are externally connected to the semiconductor integrated circuit device 100 as illustrated in FIG. 1A.

The input voltage VIN is applied to a source of the P-channel MOSFET 2 via a terminal PVIN. The P-channel MOSFET 2 has its drain connected to a drain of the N-channel MOSFET 3. A ground potential is applied to a source of the N-channel MOSFET 3 via a terminal PGND. That is, the P-channel MOSFET 2 and the N-channel MOSFET 3 are connected in series between the input voltage VIN and the ground potential.

One end of the inductor L1 is connected to a connection node between the P-channel MOSFET 2 and the N-channel MOSFET 3 via a terminal SW. The other end of the inductor L1 is connected to one end of the output capacitor C1. The ground potential is applied to the other end of the output capacitor C1.

The output voltage VOUT that develops at a connection node between the inductor L1 and the output capacitor C1 is supplied to a load (not depicted). The output voltage VOUT is also supplied to the control unit 1 via a monitor terminal VOUTS. The monitor terminal VOUTS is provided to monitor the output voltage VOUT. In the present embodiment, the output voltage VOUT monitored with the monitor terminal VOUTS is used for feedback control exercised by the control unit 1. It should be noted, however, that the output voltage VOUT monitored with the monitor terminal VOUTS is not limited in application to feedback control. For example, in the case where the output voltage VOUT monitored with the monitor terminal VOUTS falls outside a given range, the semiconductor integrated circuit device 100 may be protected by halting switching operation of the P-channel MOSFET 2 and the N-channel MOSFET 3.

It should be noted that, unlike in the present embodiment, a voltage division unit for dividing the output voltage VOUT may be provided so that a divided voltage of the output voltage VOUT is supplied to the control unit 1. The voltage division unit may be incorporated in the semiconductor integrated circuit device 100 or attached externally thereto.

The control unit 1 controls switching of the P-channel MOSFET 2 and the N-channel MOSFET 3 on the basis of the output voltage VOUT. The control unit 1 is not specifically limited in how to control switching. For example, a voltage mode control method, a fixed ON-time method, a fixed OFF-time method, a hysteresis window method, and the like can be adopted. It should be noted that, unlike in the present embodiment, a current detection unit for detecting a current flow through the inductor L1 may be provided so that the control unit 1 controls switching by means of a current mode control method. The current detection unit may be incorporated in the semiconductor integrated circuit device 100 or attached externally thereto.

Although, in the present embodiment, the semiconductor integrated circuit device 100 and its external components form a synchronous rectifying switching power supply device, the synchronous rectifying switching power supply device may be changed to a diode rectifying switching power supply device. In the case where a diode rectifying switching power supply device is used, it is sufficient if the N-channel MOSFET 3 is replaced with a diode. Also, unlike in the present embodiment, the P-channel MOSFET 2 and the N-channel MOSFET 3 may be external components of the semiconductor integrated circuit device 100. Also, an N-channel MOSFET may be used in place of the P-channel MOSFET 2 to provide a bootstrap circuit for driving the N-channel MOSFET in question. Also, bipolar transistors may be used in place of the MOSFETs.

Although, in the present embodiment, the semiconductor integrated circuit device 100 and its external components form a step-down switching power supply device, the step-down switching power supply device may be changed to a step-up switching power supply device or a step-up/down switching power supply device. Also, although, in the present embodiment, the semiconductor integrated circuit device 100 and its external components form a switching power supply device, the switching power supply device may be changed to a linear power supply device. The linear power supply device includes an output transistor and a control unit that controls the output transistor on the basis of the output voltage of the linear power supply device in question. In the linear power supply device, the output transistor and the control unit may both be incorporated in the semiconductor integrated circuit device. Alternatively, the control unit may be incorporated in the semiconductor integrated circuit device, with the output transistor attached externally to the semiconductor integrated circuit device.

The voltage source VS1 supplies the voltage VDD to a terminal AVIN. The ground potential is applied to a ground end of the voltage source VS1 and a terminal AGND.

The internal power supply unit 4 generates an internal supply voltage VREG by using the voltage VDD applied to the terminal AVIN. The internal supply voltage VREG is used, for example, as supply voltages of the control unit 1, the test unit 5, and the determination unit 6.

The test unit 5 outputs a test signal TS1 to the monitor terminal VOUTS prior to activation of the switching power supply device.

Figure 1B:
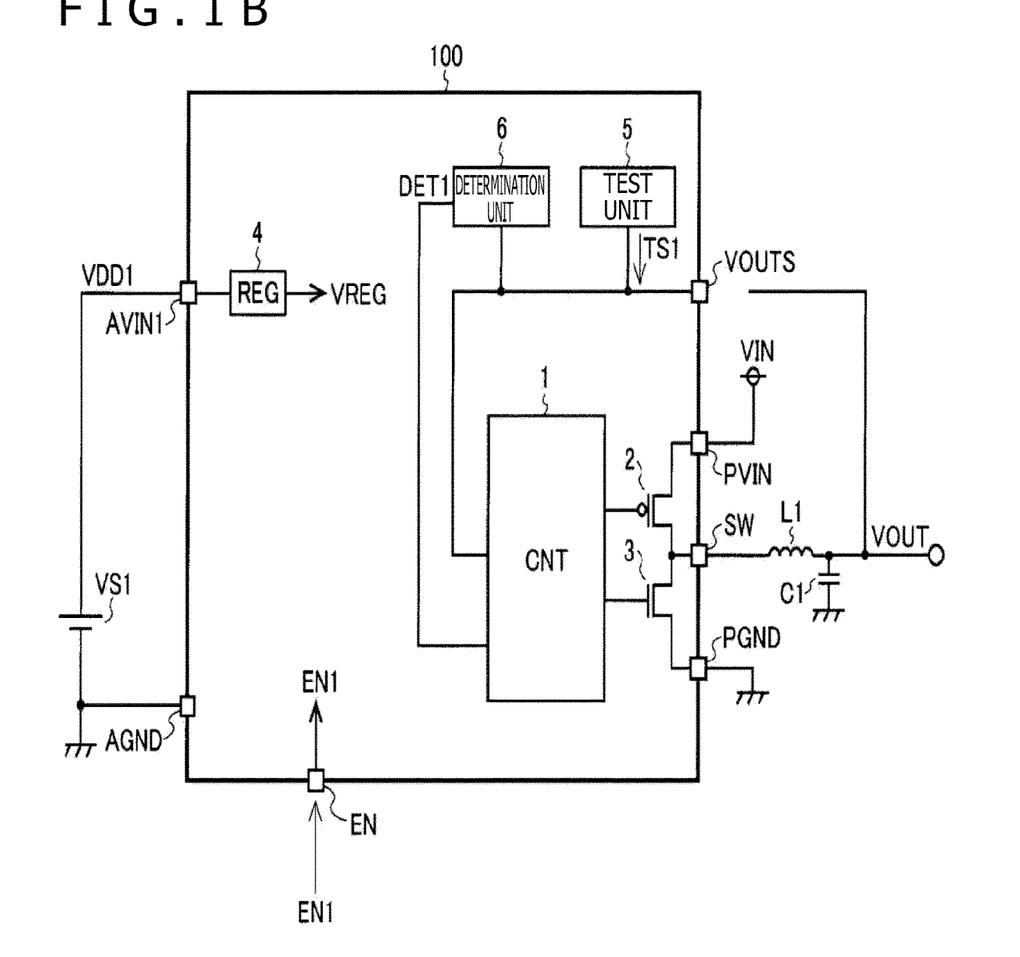
FIG. 1B is a diagram illustrating a state in which an output terminal of the semiconductor integrated circuit device according to the embodiment is open.

The test signal TS1 is a signal in the form of electric charge supplied from the test unit 5 to the monitor terminal VOUTS. Accordingly, in the case where the monitor terminal VOUTS is open as illustrated in FIG. 1B, the output of the test signal TS1 from the test unit 5 to the monitor terminal VOUTS causes the voltage of the monitor terminal VOUTS to increase. Meanwhile, in the case where the monitor terminal VOUTS is not open, the electric charge supplied from the test unit 5 to the monitor terminal VOUTS is further supplied from the monitor terminal VOUTS to the output capacitor C1, thus charging the output capacitor C1 and keeping, to a minimum, an increase in the voltage of the monitor terminal VOUTS by the output capacitor C1.

That is, in the case where the test signal TS1 is output to the monitor terminal VOUTS prior to the activation of the switching power supply device, the monitor terminal VOUTS varies in voltage level depending on whether or not the monitor terminal VOUTS is open.

Figure 2:
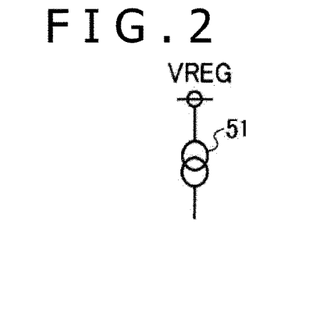
FIG. 2 is a diagram illustrating a configuration example of a test unit.
Figure 3:
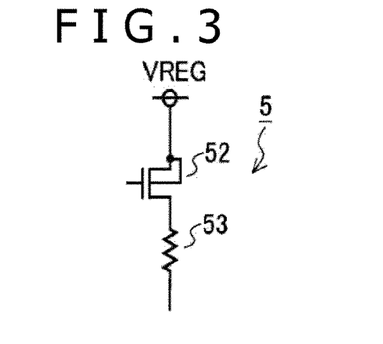
FIG. 3 is a diagram illustrating another configuration example of the test unit.
Figure 4:
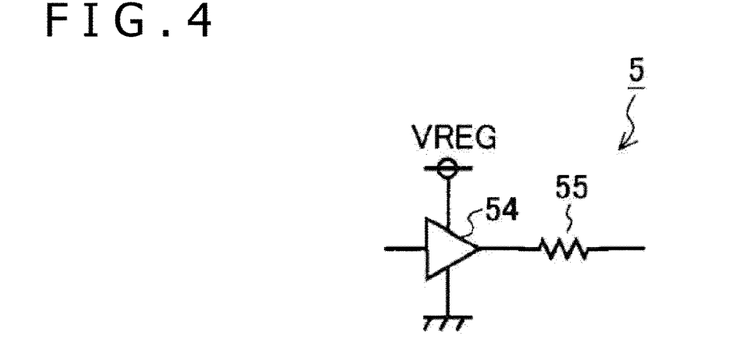
FIG. 4 is a diagram illustrating still another configuration example of the test unit.

Here, configuration examples of the test unit 5 are illustrated in FIGS. 2 to 4.

The test unit 5 of the configuration example illustrated in FIG. 2 includes a current source 51. The internal supply voltage VREG is applied to one end of the current source 51, and the other end of the current source 51 is connected to the monitor terminal VOUTS (not depicted in FIG. 2). The current source 51 turns ON only during a BIST period, outputting the test signal TS1 (output current of the current source 51) to the monitor terminal VOUTS. That is, the test unit 5 of the configuration example illustrated in FIG. 2 refrains from outputting the test signal TS1 after the activation of the switching power supply device. This ensures that there is no fear of the test signal TS1 adversely affecting the post-activation operation of the switching power supply device.

The test unit 5 of the configuration example illustrated in FIG. 3 includes a switch 52 and a resistor 53. The internal supply voltage VREG is applied to one end of the switch 52, and the other end of the switch 52 is connected to the monitor terminal VOUTS (not depicted in FIG. 3) via the resistor 53. The switch 52 turns ON only during the BIST period. When the switch 52 turns ON, the resistor 53 outputs the test signal TS1 (current proportional to a potential difference across the resistor 53) to the monitor terminal VOUTS. That is, the test unit 5 of the configuration example illustrated in FIG. 3 refrains from outputting the test signal TS1 after the activation of the switching power supply device, similarly to the test unit 5 of the configuration example illustrated in FIG. 2.

The test unit 5 of the configuration example illustrated in FIG. 4 includes a buffer amplifier 54 and a resistor 55. The internal supply voltage VREG is applied to a power supply terminal of the buffer amplifier 54, whereas a ground voltage is applied to a ground terminal of the buffer amplifier 54. A high-level voltage is applied to an input terminal of the buffer amplifier 54 only during the BIST period, whereas a high-level voltage is output from an output terminal of the buffer amplifier 54 only during the BIST period. The output terminal of the buffer amplifier 54 is connected to the monitor terminal VOUTS (not depicted in FIG. 4) via the resistor 55. When a high-level voltage is applied to the input terminal of the buffer amplifier 54, the resistor 55 outputs the test signal TS1 (current proportional to the potential difference across the resistor 55) to the monitor terminal VOUTS. That is, the test unit 5 of the configuration example illustrated in FIG. 4 also refrains from outputting the test signal TS1 after the activation of the switching power supply device, similarly to the test unit 5 of the configuration example illustrated in FIG. 2 and the test unit 5 of the configuration example illustrated in FIG. 3.

It is sufficient if the above BIST period starts, for example, when an enable signal EN1 supplied from external equipment of the semiconductor integrated circuit device 100 to an enable terminal EN goes from low to high. Also, it is sufficient if the above BIST period ends, for example, when a counter (not depicted), provided in the semiconductor integrated circuit device 100 to initiate its counting operation from the start of the BIST period, detects that a certain amount of time has elapsed from the start of the BIST period.

The determination unit 6 determines whether or not the monitor terminal VOUTS is open, on the basis of the voltage of the monitor terminal VOUTS when the test unit 5 outputs the test signal TS1 to the monitor terminal VOUTS, outputting a signal DET1 indicating the determination result. For example, the determination unit 6 determines that the monitor terminal VOUTS is open if the voltage of the monitor terminal VOUTS when the test unit 5 outputs the test signal TS1 to the monitor terminal VOUTS is equal to or greater than a threshold, whereas the determination unit 6 determines that the monitor terminal VOUTS is not open if the voltage of the monitor terminal VOUTS is smaller than the threshold.

The signal DET1 indicating the determination result of the determination unit 6 is supplied, for example, to the control unit 1. In the case where the determination unit 6 determines that the monitor terminal VOUTS is open, the control unit 1 refrains from performing switching operation of the P-channel MOSFET 2 and the N-channel MOSFET 3. This prevents the switching power supply device from being activated in the case where the determination unit 6 determines that the monitor terminal VOUTS is open.

Figure 5:
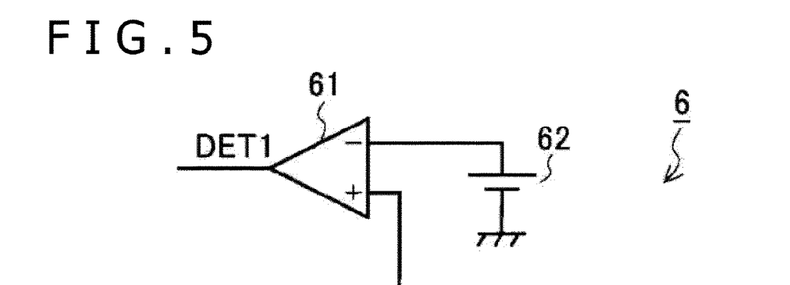
FIG. 5 is a diagram illustrating a configuration example of a determination unit.
Figure 6:
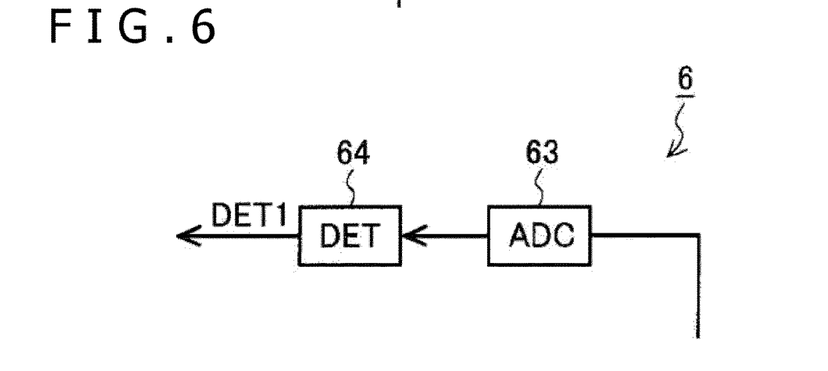
FIG. 6 is a diagram illustrating another configuration example of the determination unit.
Figure 7:
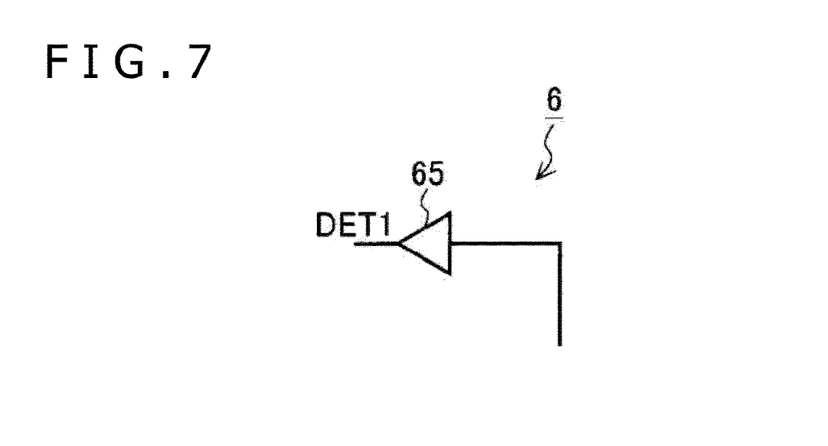
FIG. 7 is a diagram illustrating still another configuration example of the determination unit.

Here, configuration examples of the determination unit 6 are illustrated in FIGS. 5 to 7.

The determination unit 6 of the configuration example illustrated in FIG. 5 includes a comparator 61 and a reference voltage source 62. A non-inverting input terminal of the comparator 61 is connected to the monitor terminal VOUTS (not depicted in FIG. 5). A reference voltage output from the reference voltage source 62 is applied to an inverting input terminal of the comparator 61. The reference voltage output from the reference voltage source 62 is identical in level to the above threshold. In the case where the determination unit 6 of the configuration example illustrated in FIG. 5 determines that the monitor terminal VOUTS is open, the output signal DET1 of the comparator 61 indicating the determination result is high, whereas, in the case where the determination unit 6 determines that the monitor terminal VOUTS is not open, the output signal DET1 of the comparator 61 indicating the determination result is low.

Figure 8:
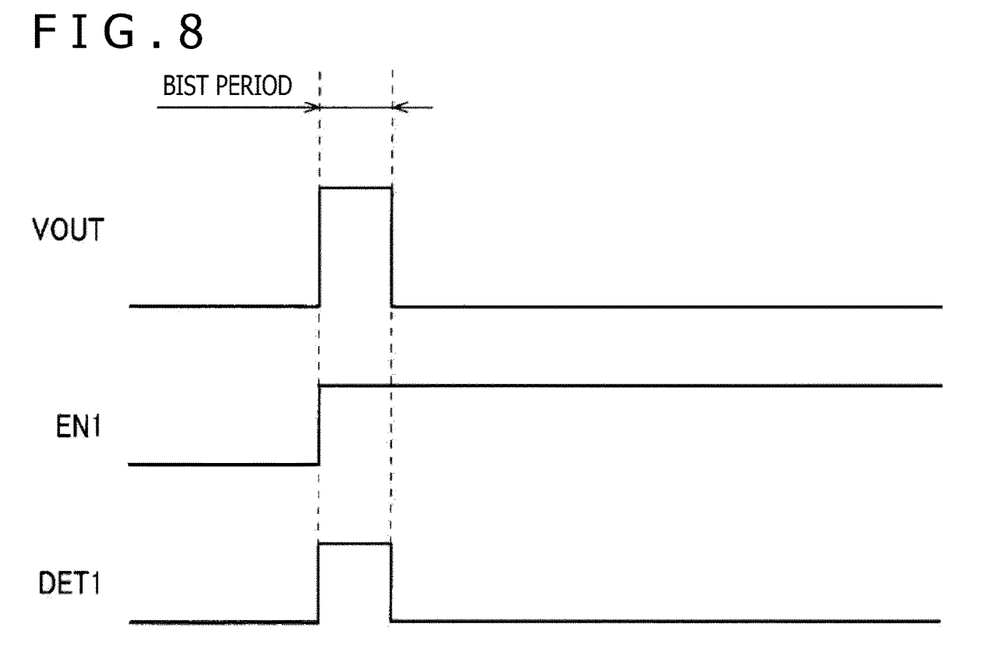
FIG. 8 is a timing diagram in the case where a monitor terminal is open.
Figure 9:
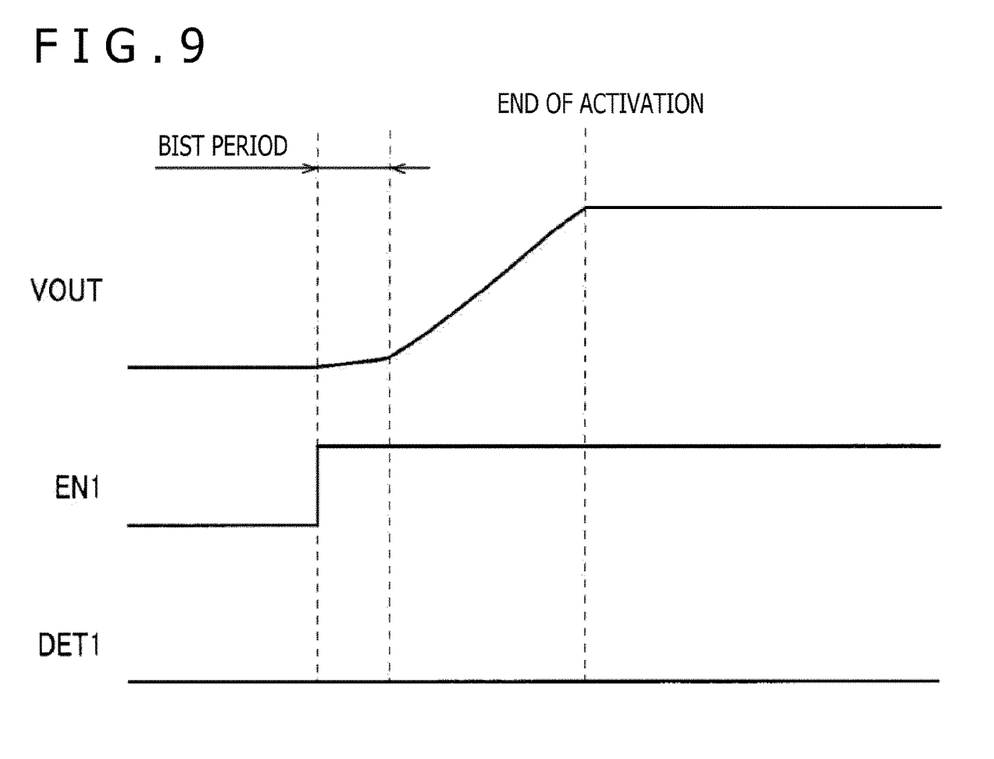
FIG. 9 is a timing diagram in the case where the monitor terminal is not open.

Accordingly, in the case where the monitor terminal VOUTS is open, a timing diagram as illustrated in FIG. 8 is obtained, whereas, in the case where the monitor terminal VOUTS is not open, a timing diagram as illustrated in FIG. 9 is obtained. Similar timing diagrams are also obtained in the case where the determination units 6 of the configuration examples illustrated in FIGS. 6 and 7 described later are used.

The determination unit 6 of the configuration example illustrated in FIG. 6 includes an analog-to-digital (A/D) converter 63 and a detection unit 64. The A/D converter 63 converts the voltage applied to the monitor terminal VOUTS from analog to digital form, thus generating a digital voltage and outputting the generated digital voltage to the detection unit 64. The detection unit 64 detects that the monitor terminal VOUTS is open when the digital voltage output from the A/D converter 63 is smaller than the predetermined threshold. In the determination unit 6 of the configuration example illustrated in FIG. 6, the signal indicating the detection result of the detection unit 64 is the signal DET1 indicating the determination result of the determination unit 6 itself.

The determination unit 6 of the configuration example illustrated in FIG. 7 includes a programmable comparator 65. An input terminal of the programmable comparator 65 is connected to the monitor terminal VOUTS (not depicted in FIG. 7). The programmable comparator 65 outputs a high-level signal when the voltage of the monitor terminal VOUTS is equal to or larger than the threshold and outputs a low-level signal when the voltage of the monitor terminal VOUTS is smaller than the threshold. The programmable comparator 65 can change the above threshold by rewriting a setting with digital data. In the determination unit 6 of the configuration example illustrated in FIG. 7, in the case where the monitor terminal VOUTS is determined to be open, the output signal DET1 of the programmable comparator 65 indicating the determination result is high, whereas, in the case where the monitor terminal VOUTS is determined not to be open, the output signal DET1 of the programmable comparator 65 indicating the determination result is low.

<2. Semiconductor Integrated Circuit Device According to Modification Example>

Figure 10:
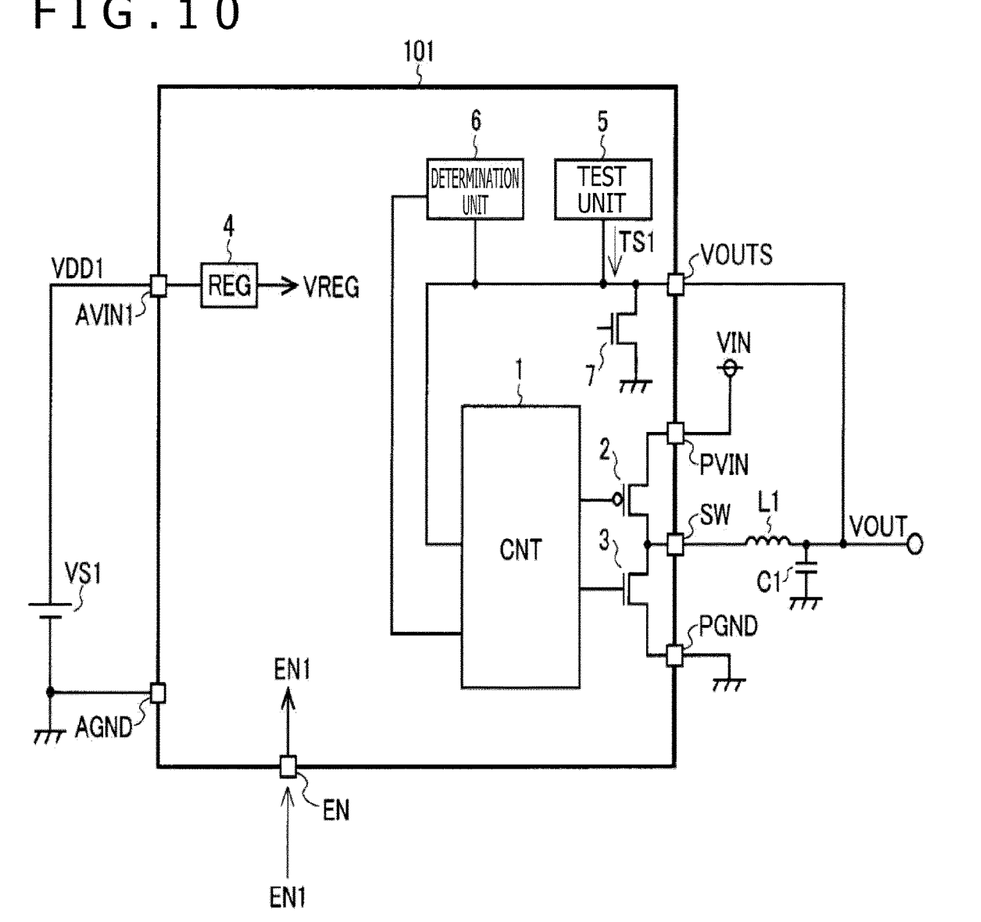
FIG. 10 is a diagram illustrating a configuration of the semiconductor integrated circuit device according to another modification example.

FIG. 10 is a diagram illustrating a configuration of a semiconductor integrated circuit device 101 according to a modification example (hereinafter referred to as the "semiconductor integrated circuit device 101").

The semiconductor integrated circuit device 101 differs from the semiconductor integrated circuit device 100 in that a discharge unit 7 is provided. In the configuration example illustrated in FIG. 10, the discharge unit 7 has a switch. As the switch turns ON, the discharge unit 7 discharges the output capacitor C1.

For example, if the enable signal EN1 goes from high to low, the discharge unit 7 discharges the output capacitor C1 during a time period from the time when the enable signal EN1 goes from high to low until the time when the discharge state of the output capacitor C1 reaches a given range. That is, the semiconductor integrated circuit device 101 is configured such that, despite an attempt to activate the switching power supply device again by pulling the enable signal EN1 from low to high level following a shutdown by switching the enable signal EN1 from high to low level, the switching power supply device is not activated again until the discharge state of the output capacitor C1 reaches a certain range (until the output voltage VOUT drops to a given level or less). This ensures improved accuracy of the determination result produced by the determination unit 6 during the BIST period.

It should be noted that the determination unit 6 preferably determines whether or not the discharge state of the output capacitor C1 falls within a given range, as well. This eliminates the need to provide a section for determining whether or not the discharge state of the output capacitor C1 falls within the given range separately from the determination unit 6, thus contributing to downsizing and cost reduction of the semiconductor integrated circuit device 101.

<3. Application>

Figure 11:
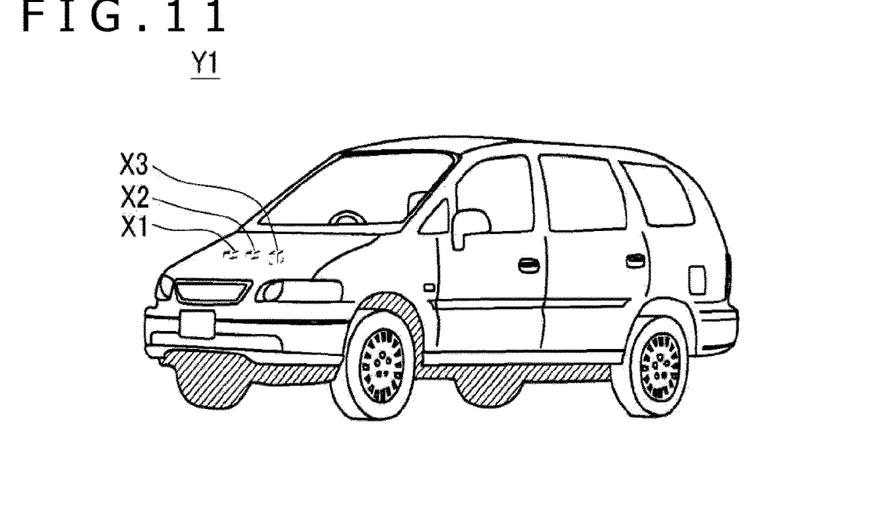
FIG. 11 is an external view of a vehicle.

An example of application of the semiconductor integrated circuit device 100 and the semiconductor integrated circuit device 101 described earlier will be described next. FIG. 11 is an external view of a vehicle. A vehicle Y1 is equipped with a semiconductor integrated circuit device X1, either the semiconductor integrated circuit device 100 or the semiconductor integrated circuit device 101, a group of external components X2 of the semiconductor integrated circuit device X1, and a battery X3.

The battery X3 supplies the input voltage VIN to the semiconductor integrated circuit device X1. The input voltage VIN is converted to the output voltage VOUT by the semiconductor integrated circuit device X1 and the external component group X2. The output voltage VOUT is used, for example, as a supply voltage of an image processing circuit for processing captured images of a perimeter surveillance camera mounted to the vehicle Y1.

<4. Others>

It should be noted that, in addition to the above embodiment, the configuration of the present disclosure can be changed in various ways without departing from the gist of the present disclosure.

For example, although the discharge unit 7 is provided in the semiconductor integrated circuit device 101 illustrated in FIG. 10, the N-channel MOSFET 3, controlled by the control unit 1, may be used to discharge the output capacitor C1 as a discharge unit in place of the discharge unit 7.

Although a semiconductor integrated circuit device mounted to a vehicle has been described as an application example of the semiconductor integrated circuit device in the above embodiment, the present disclosure is not limited thereto. The semiconductor integrated circuit device according to the present disclosure can find use in any fields (e.g., home electric appliances, automobile, and industrial machinery).

As described above, the above embodiment should be construed as illustrative and not restrictive in all respects, and the technical scope of the present disclosure should be understood to be defined not by the description of the above embodiment but by the appended claims and to encompass any modifications in the sense and scope equivalent to those of the claims.

What is claimed is:

1. A semiconductor integrated circuit device, comprising:
a control unit configured to control one of a switching element or an output transistor of a power supply device;
a monitor terminal configured to monitor an output voltage of the power supply device;
a test unit configured to output a test signal to the monitor terminal before activation of the power supply device;
a discharge unit configured to discharge an output capacitor of the power supply device until a state of discharge of the output capacitor is within a predetermined range, wherein the output capacitor is discharged at a timing when an enable signal goes from high to low; and
a determination unit configured to:
determine whether the monitor terminal is open, based on a voltage of the monitor terminal when the test signal is output to the monitor terminal; and
determine, based on the discharge of the output capacitor, whether the state of the discharge of the output capacitor is within the predetermined range,
wherein the control unit is further configured to control the power supply device based on the determination whether the monitor terminal is open and the determination of the state of discharge of the output capacitor.

2. The semiconductor integrated circuit device according to claim 1, wherein, in a case where the monitor terminal is open, the output of the test signal from the test unit to the monitor terminal increases the voltage of the monitor terminal.

3. The semiconductor integrated circuit device according to claim 2, wherein in a case where the monitor terminal is not open, the output capacitor of the power supply device controls the increase in the voltage of the monitor terminal to be minimum.

4. The semiconductor integrated circuit device according to claim 1, wherein the test unit refrains from outputting the test signal after the activation of the power supply device.

5. A vehicle, comprising:
a semiconductor integrated circuit device that includes:
a control unit configured to control one of a switching element or an output transistor of a power supply device;
a monitor terminal configured to monitor an output voltage of the power supply device;
a test unit configured to output a test signal to the monitor terminal before activation of the power supply device;
a discharge unit configured to discharge an output capacitor of the power supply device until a state of discharge of the output capacitor is within a predetermined range, wherein the output capacitor is discharged at a timing when an enable signal goes from high to low; and
a determination unit configured to:
determine whether the monitor terminal is open, based on a voltage of the monitor terminal when the test signal is output to the monitor terminal; and
determine, based on the discharge of the output capacitor, whether the state of the discharge of the output capacitor is within the predetermined range,
wherein the control unit is further configured to control the power supply device based on the determination whether the monitor terminal is open and the determination of the state of discharge of the output capacitor.

6. The semiconductor integrated circuit device according to claim 1, wherein
the test unit includes a current source, and
the current source is configured to:
turn on only during a BIST period; and
output the test signal based on the turn on of the current source.

7. The semiconductor integrated circuit device according to claim 1, wherein
the test unit includes a switch and a resistor,
the switch is configured to turn on only during a BIST period, and
the resistor is configured to output the test signal based on the turn on of the switch.

8. The semiconductor integrated circuit device according to claim 1, wherein
the test unit includes a buffer amplifier and a resistor,
the buffer amplifier includes:
an input terminal configured to receive a high-level voltage during a BIST period; and
an output terminal configured to output the high-level voltage during the BIST period, and
the resistor is configured to output the test signal based on the high-level voltage received by the input terminal.

9. The semiconductor integrated circuit device according to claim 1, wherein the determination unit includes:
a reference voltage source configured to output a reference voltage; and
a comparator that includes:
a non-inverting input terminal configured to receive the voltage of the monitor terminal; and
an inverting input terminal configured to receive the reference voltage, wherein
the comparator is configured to output a determination signal based on the received voltage of the monitor terminal and the received reference voltage,
the determination signal of the comparator is high in a case where the monitor terminal is open, and
the determination signal of the comparator is low in a case where the monitor terminal is not open.

10. The semiconductor integrated circuit device according to claim 1, wherein
the determination unit includes an analog-to-digital (A/D) converter and a detection unit,
the A/D converter is configured to:
convert the voltage applied to the monitor terminal to a digital voltage; and
output the digital voltage, and
the detection unit is configured to detect that the monitor terminal is open based on the output digital voltage being lower than a threshold value.

11. The semiconductor integrated circuit device according to claim 1, wherein
the determination unit includes a comparator, and
the comparator is configured to:
output a high-level signal in a case where the voltage of the monitor terminal is one of equal to or higher than a threshold value;
output a low-level signal in a case where the voltage of the monitor terminal is lower than the threshold value; and
change the threshold value by rewriting a setting with digital data.

* * * * *